United States Patent [19]

Wilczynski

[11] Patent Number: 4,595,295

[45] Date of Patent: Jun. 17, 1986

[54] ALIGNMENT SYSTEM FOR LITHOGRAPHIC PROXIMITY PRINTING

[75] Inventor: Janusz S. Wilczynski, Ossining, N.Y.

[73] Assignee: International Business Machines Corporation, Armonk, N.Y.

[21] Appl. No.: 684,432

[22] Filed: Dec. 20, 1984

Related U.S. Application Data

[63] Continuation of Ser. No. 337,543, Jan. 6, 1982, abandoned.

[51] Int. Cl.$^4$ .............................................. G01B 11/27
[52] U.S. Cl. ....................................... 356/401; 356/400
[58] Field of Search .................. 356/399, 400, 401; 250/557; 350/437

[56] References Cited

U.S. PATENT DOCUMENTS

| | | | |
|---|---|---|---|
| 3,709,579 | 1/1973 | Makosch | 356/399 |
| 3,794,409 | 2/1974 | Johnson | 350/437 |
| 3,990,798 | 11/1976 | White | 356/401 |
| 4,232,969 | 11/1980 | Wilczynski | 356/401 |
| 4,385,838 | 5/1983 | Nakazawa et al. | 356/401 |

FOREIGN PATENT DOCUMENTS

52-46  1/1977  Japan .................... 350/437

Primary Examiner—R. A. Rosenberger
Attorney, Agent, or Firm—Ronald L. Drumheller

[57] ABSTRACT

An alignment system is described for lithographic proximity printing apparatus wherein the wafer and lithographic mask are each individually aligned with a third element. An alignment mask carries an alignment pattern corresponding to an alignment mark on the microcircuit wafer and also carries an alignment pattern corresponding to an alignment mark on the proximity printing mask. In one embodiment, the alignment mask is illuminated from the back side by alignment radiation (which need not be visible light) and the alignment patterns carried by the alignment mask are imaged onto the corresponding wafer and proximity printing mask alignment marks. Since the projected alignment patterns are spatially separated at the alignment mask one of the alignment patterns is conveniently shifted in effective optical position to compensate for the difference in axial position of the wafer and printing mask alignment marks. When a projected alignment pattern image correlates with (i.e., overlays) the corresponding alignment mark, reflected or scattered light leaving the alignment mark is either at a maximum or at a minimum (i.e., an extremum) depending upon the system configuration. A light splitter deflects some of the light coming from each of the alignment marks to individual light intensity monitors, such as photomultipliers. Alignment of the wafer and printing mask has been achieved when both intensity monitors reach the correct extremum simultaneously (or reach the midpoint of the correct extremum if the extremum is not sharp).

18 Claims, 8 Drawing Figures

ALIGNMENT SYSTEM FOR LITHOGRAPHIC PROXIMITY PRINTING

This is a continuation of application Ser. No. 337,543 filed 1-6-82 now abandoned.

FIELD OF THE INVENTION

This invention relates to systems for aligning a microcircuit wafer and an overlying closely spaced lithographic pattern mask for lithographic proximity printing during manufacture of microcircuit electronic components, and more particularly, it relates to a system of this type which may be readily automated.

BACKGROUND OF THE INVENTION

During conventional fabrication of microcircuit components, patterns are successively transferred from masks to resist layers on a wafer. In order to build a useful microcircuit component, each successive pattern must be accurately aligned with previously transferred underlying patterns. As the linewidth of microcircuits gets smaller, alignment accuracy must be correspondingly improved. Furthermore, the number of alignment steps needed to fabricate a single microcircuit component has been increasing, thus making an automatic alignment system highly desirable.

One method of transferring a pattern from a mask to an optically sensitive wafer surface is by optical projection printing. This technique has the advantage that the pattern on the mask can be scaled up in size for ease in fabricating the mask. A projection system then demagnifies the enlarged pattern to the desired size during a subsequent projection printing step. An accurate alignment system for projection printing which can be readily automated is described in my U.S. Pat. No. 4,232,969.

A disadvantage with projection printing is that optical focussing elements are needed. This limits the wavelength of the light which can be used for projection printing since suitable focussing elements do not exist at short wavelengths, such as for example in the soft x-ray region of about 6 Å to 25 Å in wavelength. This region is of particular interest because lithographic resist materials are being developed which are sensitive to x-rays in this region. Such shorter wavelengths are generally of interest for lithography because they promise the possibility of improved resolution, smaller linewidths and more dense, compact, faster and possibly cheaper microcircuits.

Since projection printing currently cannot be used for x-ray lithography, proximity printing is contemplated instead. This method places the mask very close to but not in contact with the wafer because contact would cause damage to the wafer surface and the mask. The proximity mask is then flooded with actinic radiation. While proximity printing is a generally well known lithographic technique, highly accurate alignment techniques still do not exist for this method and none of the known alignment techniques for proximity printing systems are readily automatable.

Prior art alignment systems for proximity printing generally involve the use of a split field alignment microscope. A person visually observes through a microscope an alignment mark on the wafer and an alignment mark on the proximity mask and then adjusts the relative position of the proximity mask and wafer until the marks are aligned. One problem is that the marks are not in the same object plane (typically they are separated by 20–60 μm) and microscopes typically can be focussed only on one plane at a time. One solution is to use a low numerical aperture optical system so that there is a large depth of field, but this results in lower resolution and consequently lower alignment accuracy. Another solution is to use a bifocal optical system. Such a system is described, for example, by A. White in "Simple bifocus element for microscope objectives", 16 Appl. *Optics* 549 (1977). Unfortunately, bifocal elements have reduced contrast and any microscope which uses visible light has resolution limits imposed by the wavelength of the light employed. Automation of such systems has not been particularly successful because of the inherent complexity involved in aligning (and consequently matching) two images electronically.

SUMMARY OF THE INVENTION

An object of this invention is to provide an alignment system for microcircuit lithography proximity printing systems with an alignment accuracy suitable for x-ray lithography.

Another object is to provide an alignment system for lithographic proximity printing systems which is readily automatable.

These and further objects and advantages are achieved by my invention, wherein the wafer and proximity mask are each individually aligned to a third element, an alignment mask.

The alignment mask carries an alignment pattern corresponding to an alignment mark on the microcircuit wafer and also carries an alignment pattern corresponding to an alignment mark on the proximity printing mask. In one embodiment, the alignment mask is illuminated from the back side by alignment radiation (which need not be visible light) and the alignment patterns carried by the alignment mask are imaged onto the corresponding wafer and proximity printing mask alignment marks. Since the projected alignment patterns are spatially separated at the alignment mask one of the alignment patterns is conveniently shifted in effective optical position to compensate for the difference in axial position of the wafer and printing mask alignment marks. When a projected alignment pattern image correlates with (i.e., overlays) the corresponding alignment mark, reflected or scattered light leaving the alignment mark is either at a maximim or at a minimum (i.e., an extremum) depending upon the system configuration. A light splitter deflects some of the pattern light coming from each of the alignment marks to individual light intensity monitors, such as photomultipliers. Alignment of the wafer and printing mask has been achieved when both intensity monitors reach the correct extremum simultaneously (or the midpoint of the correct extremum if the extremum is not sharp).

The optical system is bidirectional so that the intensity monitors and the alignment radiation source may be exchanged in position. Preferably the light splitter is an apertured mirror which splits the numerical aperture of the objective so that dark field illumination may be used for improved sensitivity and signal to noise ratio. The alignment mask actually does the alignment pattern matching, thereby facilitating automation and permitting optimizations in the optical system.

DETAILED DESCRIPTION OF THE INVENTION

The principles of my invention will now be described in connection with FIG. 1, which illustrates a simplified visually monitored and mannually controlled embodiment having bright field illumination. Wafer 10 carries an alignment mark 12 and is positioned parallel with and is closely spaced from a lithographic proximity printing mask 14 carrying an alignment mark 16. Proximity mask 14 obviously must be transparent to alignment radiation in region 19 immediately above wafer alignment mark 12. If the proximity mask supporting substrate 17 is transparent to alignment radiation, this region 19 overlying wafer mark 12 merely needs to be free from opaque mask material 21. Otherwise an aperture must be provided in the proximity mask substrate at region 19. As illustrated, plane 18 defined by the wafer alignment mark 12 is spaced from plane 20 defined by the proximity mask alignment mark 16. A typical spacing is about 20 to 60 $\mu$m. The position of wafer 10 within plane 18 may be controlled via line 22 by conventional position adjustment apparatus 24. Also, the position of proximity mask 14 within plane 20 may be controlled via line 26 also by apparatus 24. Apparatus 24 and consequently the relative position of wafer 10 and proximity mask 14 are controlled manually via line 28.

Alignment mask 30 defines a third plane 32 and carries a first transparent mask pattern 34 corresponding to wafer mark 12 and a second transparent mask pattern 36 corresponding to the proximity printing mask mark 16. An objective 38 images plane 32 and plane 20 onto each other through beam splitter 40. A block of transparent material 42 having appropriate index of refraction and thickness shifts the image of pattern 34 downward from plane 20 to plane 18 so that at alignment the image of pattern 36 will fall on mark 16 in focus while the image of pattern 34 will simultaneously fall on mark 12 also in focus, even though objective 38 may have a high numerical aperture, which is preferred.

Beam splitter 40 defines a fourth plane 42 such that objective 38 also images plane 20 and plane 42 onto each other. Thus, a first bidirectional light propogation path 44 is formed from alignment mask pattern 34 through beam splitter 40 and objective 38 to wafer mark 12, reflecting then back from mark 12 through objective 38 and reflecting from beam splitter 40 to position 46 in front of eyepiece 47 and observation eye 48. A second bidirectional light propogation path 50 is also formed from alignment mask pattern 36 through beam splitter 40 and objective 38 to the printing mask mark 16, reflecting then back from mark 16 through objective 38 and reflecting from beam splitter 40 to position 52 in front of eyepiece 47 and observation eye 48.

A source of alignment radiation 54, illuminates the back side of alignment mask 30 through a lens 56, thereby causing a pattern of light corresponding to wafer mark 12 to be imaged by objective 38 along path 44 to the position in plane 18 where wafer mark 12 is to be located at alignment. Simultaneously another pattern of light corresponding to proximity mask mark 16 is imaged by objective 38 along path 50 to the position in plane 20 where printing mask mark 16 is to be located at alignmerft. Eye 48 simultaneously observes any reflection of these light patterns. When wafer 10 is properly positioned, the projected light pattern from the alignment mask pattern 34 correlates (i.e., maximally overlaps) with the reflective wafer mark 12 (assuming the wafer mark is reflective and the background is not reflective rather than the reverse, which is an obvious alternative) and the light intensity of this pattern observed by eye 48 will reach a maximum. Also, when proximity mask 14 is properly positioned, the projected light pattern from the alignment mask pattern 36 correlates (i.e., maximally overlaps) with the reflective proximity mask mark 16 (assuming again that the proximity mask mark is reflective on a non-reflective background, rather than the alternative) and the light intensity of this pattern observed by eye 48 will also reach a maximum.

Thus eye 48 monitors the intensity of both light patterns for a simultaneous extremum (maximum or minimum depending upon whether the alignment light pattern falls upon a relatively reflective or relatively absorptive mark), while adjusting the positions of wafer 10 and proximity mask 14. When both patterns are at the appropriate extremum intensity, wafer 10 and mask 14 are aligned. It should be apparent that this system would function similarly and equally well if the illumination source 54, 56 and the light intensity monitors (embodied by eyepiece 47 and eye 48) were exchanged for each other in position. Furthermore it should be apparent that if a light pattern intensity extremum is relatively flat (i.e., does not have a sharp maximum or minimum), then alignment occurs at the midpoint of the extremum.

Figure 1:
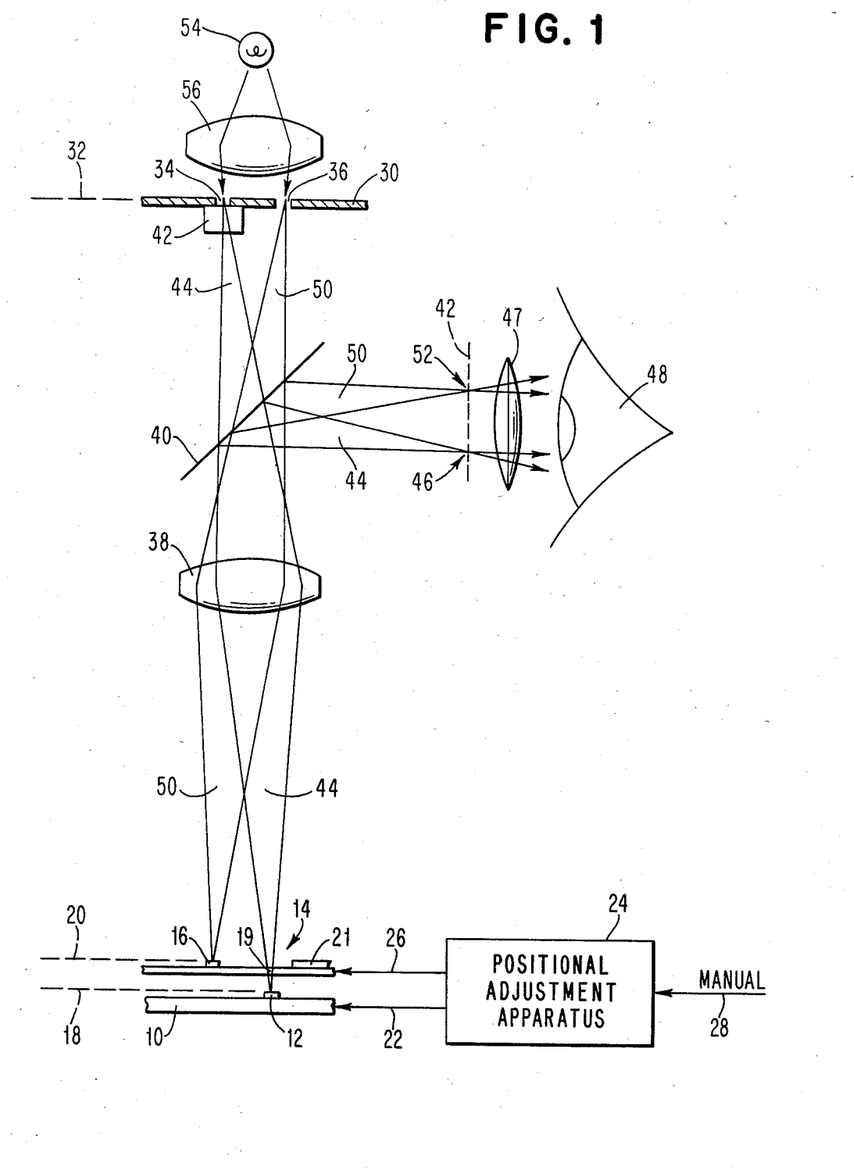
FIG. 1 illustrates the operational principles of my invention with a simplified schematical representation of a visually monitored and manually controlled alignment system having bright field illumination.
Figure 2:
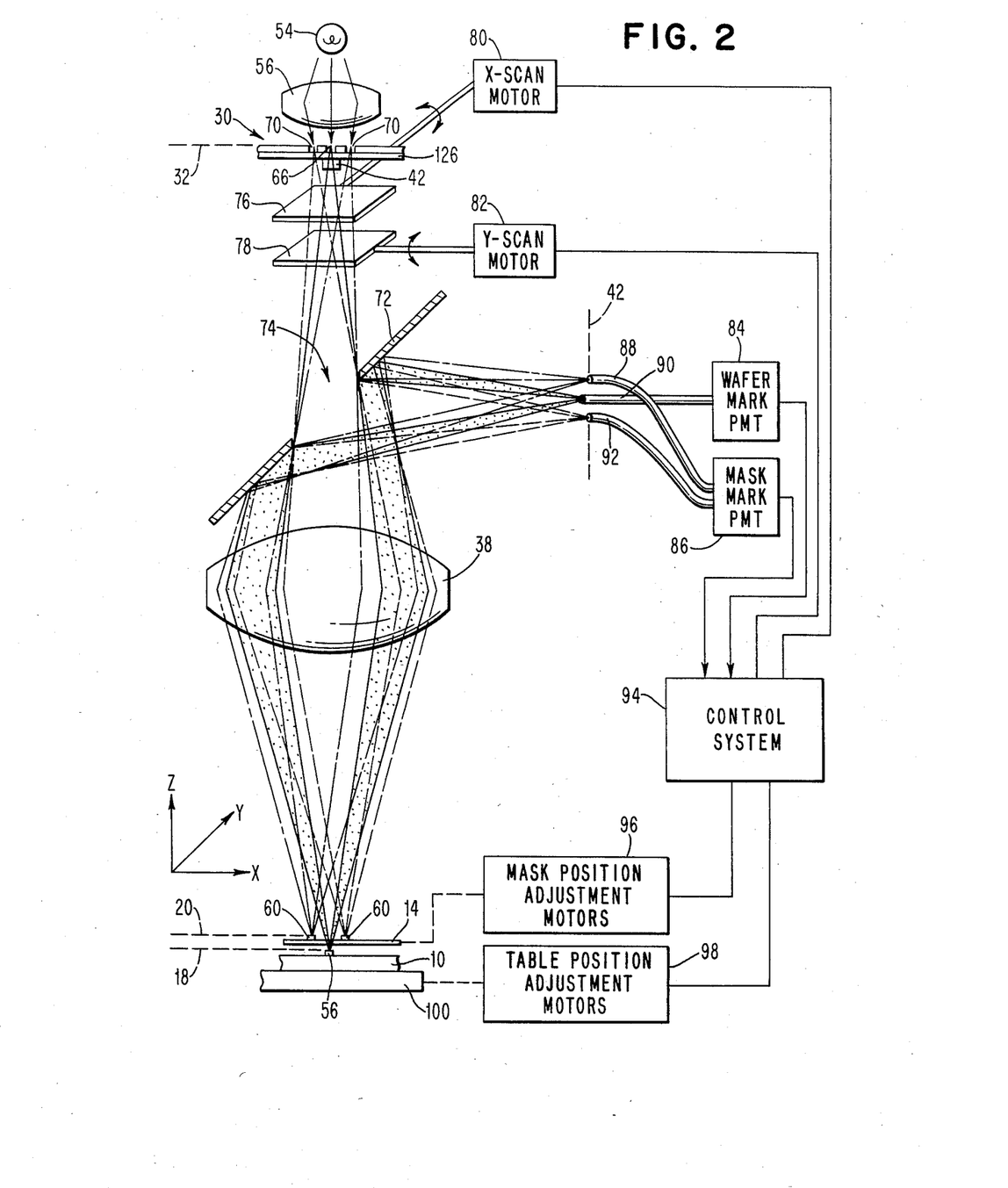
FIG. 2 illustrates a preferred embodiment of my invention with a schematical representation of an electronically monitored and automatically controlled alignment system having dark field illumination.

The FIG. 1 embodiment illustrates use of bright field illumination. Although bright field illumination can be used in practicing my invention, dark field illumination is preferred because it offers better sensitivity and a better signal-to-noise ratio and because the nature and characteristics of dark field optical signals are more predictable for reliable sensing by electronic light intensity detectors. A preferred embodiment of my invention is illustrated in FIG. 2, which employs dark field illumination.

Figure 3:
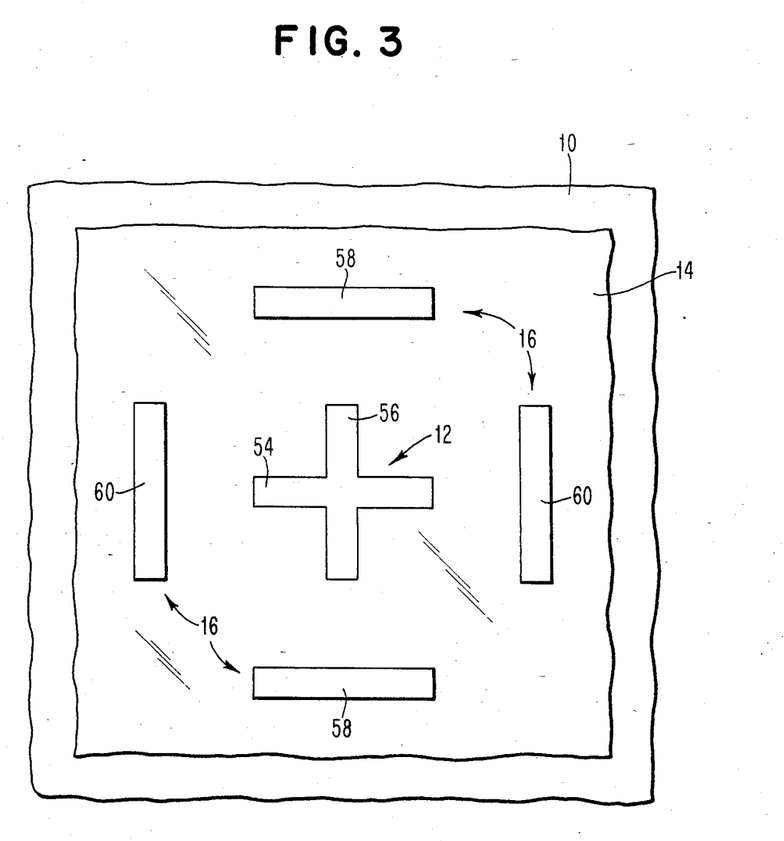
FIG. 3 is a plan view of illustrative wafer and proximity printing mask alignment marks which may be used with the FIG. 2 embodiment.

An exemplary pattern for the wafer mark 12 and an exemplary pattern for the proximity mask mark 16 are shown in FIG. 3. Wafer mark 12 comprises two perpendicular and crossing bars 54, 56 oriented in an X direction and Y direction respectively for alignment signals in the Y direction and X direction respectively. Mask mark 16 comprises four bars, two parallel bars 58 being oriented in the X direction for an alignment signal in the Y direction and two parallel bars 60 being oriented in the Y direction for an alignment signal in the X direction.

Figure 4:
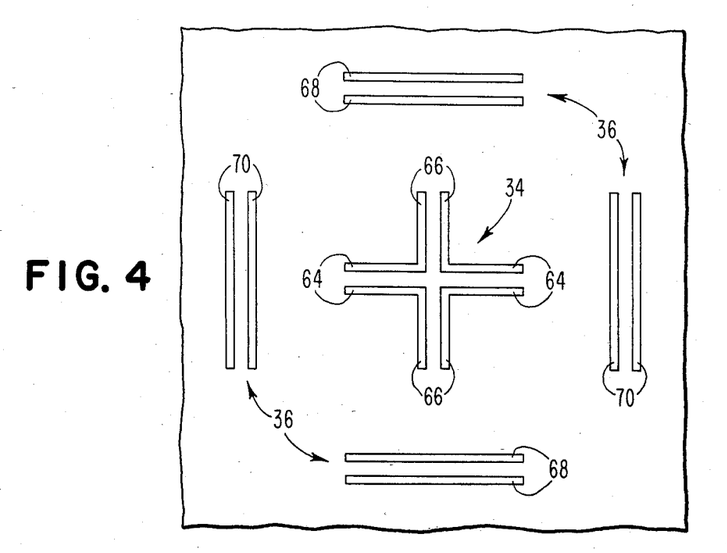
FIG. 4 is a plan view of an alignment mask which may be used to align the FIG. 3 wafer and proximity mask alignment marks.

Corresponding alignment mask patterns 34, 36 are shown in FIG. 4 and consist of narrow slits in an otherwise opaque mask area. Slits 64 oriented in the X direction correspond with the edges of bar 54 of the wafer alignment mark 12, while slits 56 oriented in the Y direction correspond with the edges of bar 56 of mark 12. Slits 68 oriented in the X direction correspond with the edges of bars 58 of the mask alignment mark 12, while slits 70 oriented in the Y direction correspond with the edges of bars 60 of the mask alignment mark 12.

It should be noted that the proximity printing mask alignment mark illustrated in FIG. 3 has two bars 60 for the X direction and two bars 58 for the Y direction, while the wafer alignment mark has only one bar 56 for the X direction and one bar 54 for the Y direction. The printing mask alignment signal thus can be expected to have greater sensitivity than the wafer alignment signal. The situation could just as well be reversed and serves merely to illustrate a symmetrical mark arrangement as well as a mark configuration which is not confined to a single isolated region. The alignment marks shown in FIG. 3 are also illustrated in cross-section in FIG. 2. However because of the scale of FIG. 2 the fine double slits in the alignment patterns shown in FIG. 4 have been represented instead by single wider slits carrying the same identifying reference numbers. It should be understood that the actual alignment mask pattern described in connection with the FIG. 2 embodiment is shown in detail instead in FIG. 4.

Referring now to FIG. 2, beam splitter 40 is replaced by a different light splitting device mirror 72 having a hole or aperture 74 in the center thereof. The aperture 74 acts as an aperture stop and limits the size of the cone of light which can pass from plane 32 to planes 18, 20 and vice versa. Within this central cone, light is not deflected at all by this light splitting device. Outside of the aperture 74, this device reflects all of the light coming from planes 18, 20 onto plane 42 and vice versa. As will be described in further detail in connection with FIG. 8, if the light source is placed behind plane 42 instead, the apertured mirror 72 instead will illuminate planes 18, 20 only from directions outside of the central cone defined by the aperture 74 and transmit light travelling from planes 18, 20 to plane 32 only within the central cone. Thus, the numerical aperture of objective 38 is split into two parts, a central cone and the remaining portion of the numerical aperture, either part being within the dark field when observing through the other part. As would be apparent to one of ordinary skill in optical systems, if 100 percent dark field illumination is desired, aperture 74 should be centered about the optical axis and should project upon the object and image planes substantially as a circle. Thus aperture 74 ideally is oval in shape.

Wobble plates 76, 78 are positioned across the optical path between apertured mirror 72 and the alignment mask 30 and function to shift or scan the image projected by objective 38 back and forth in either the X direction or the Y direction. The wobble plates are suitably thick sheets of transparent material of appropriate index of refraction such that when either is oriented at an angle to the optical axis of objective 38, the image projected by objective 38 is laterally shifted in a direction perpendicular to the axis of tilt rotation. Wobble plate 76 is angularly tilted back and forth (angularly reciprocated) about the Y axis by motor 80 and causes reciprocating X axis shifts of the objective image. Wobble plate 78 is angularly tilted back and forth about the X axis by motor 82 and causes reciprocating Y axis shifts of the objective image.

I have described the apertured mirror and equivalent light splitting structures as well as wobble plates in further detail in my U.S. Pat. No. 4,232,969, which is hereby totally incorporated by reference. The function and operation of these optical elements are similar in both systems.

In the FIG. 2 embodiment, light intensity monitoring is done electronically by photomultipliers 84, 86 via optical fibers 88, 90, 92. Light from the alignment mask pattern corresponding to the wafer mark is received by fiber 90 and monitored by photomultiplier 84. Light from the alignment mask pattern corresponding to the printing mask mark is received by fibers 88, 92 and monitored by photomultiplier 86. Since the mask mark light pattern has more than one spatially separated part, different fibers are used to receive each of the various parts of the light pattern. Since the mask mark actually has four parts corresponding respectively to the four bars of the mask mark illustrated in FIG. 3, four fibers are used, all leading to PMT 86. Only two of the four fibers are illustrated because the other two are receiving light from the two mask pattern parts which are not illustrated and are farther back and farther forward in the Y direction.

Control system 94 receives the PMT signals and automatically controls scanning of the alignment image via motors 80, 82 as well as the position of wafer 10 and proximity mask 14 via mask position adjustment motors 96 and table position adjustment motors 98. The wafer 10 is actually carried by table 100, which is moved instead of the wafer itself.

Figure 7:
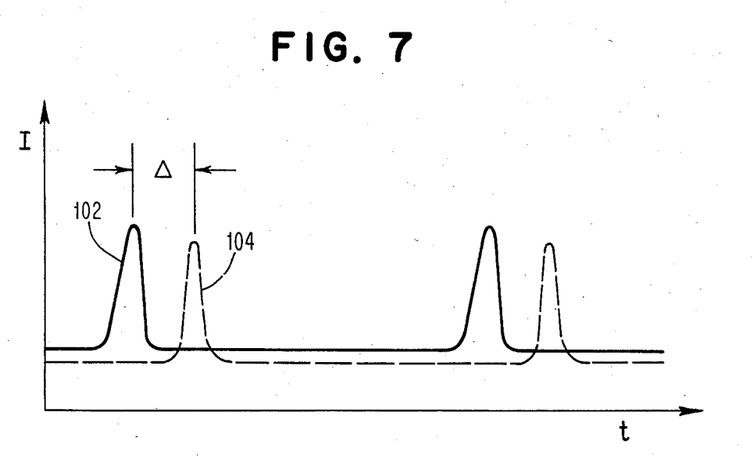
FIG. 7 graphically illustrates the light intensity signals received from misaligned wafer and proximity mask alignment marks during oscillation of the wobble plates shown in FIG. 2.

Alignment proceeds as follows. Control system 94 oscillates one of the wobble plates, say wobble plate 76 via motor 80, while monitoring the light intensities with PMT 84 and PMT 86. FIG. 7 illustrates typical light intensity signals. Signal 102, for example, may represent the light intensity sensed by PMT 84 while signal 104 may represent the light intensity sensed by PMT 86. As illustrated, light scattered from the edge of a mark and collected by a PMT reaches a maximum somewhere during the wobble plate scan and then reaches a maximum again as the wobble plate returns. When the wafer and proximity mask are not aligned with each other, the maximums (extremums) of the wafer alignment signal 102 do not positionally correspond to the maximums of the printing mask alignment signal 104. The difference in position of the maximums, Δ, is a measure of the amount of misalignment between the wafer and printing mask in the one direction (the X direction when wobble plate 76 is causing the image scan). Control system 94 senses this difference and changes the relative position of the wafer and printing mask in the X direction until the signal maximums coincide or correlate. The printing mask and wafer are now aligned in the X direction and the same procedure may be followed with the other wobble plate instead to achieve alignment also in the Y direction.

It should be apparent that the relative position of the wafer and printing mask may be changed either by moving the printing mask, or the wafer, or both. If the printing mask is held at one position and the wafer is aligned to the printing mask, the control system is similar to the control system described in detail in my U S. Pat. No. 4,232,969, except that here the X and Y wobble plates act upon the same image rather than separate images and the alignment light patterns for both the X and Y directions are sensed by the same rather than separate monitors. Suitable modification of the control circuit details described in that patent would be apparent to one of ordinary skill and thus will not be described in further detail.

Figure 6:
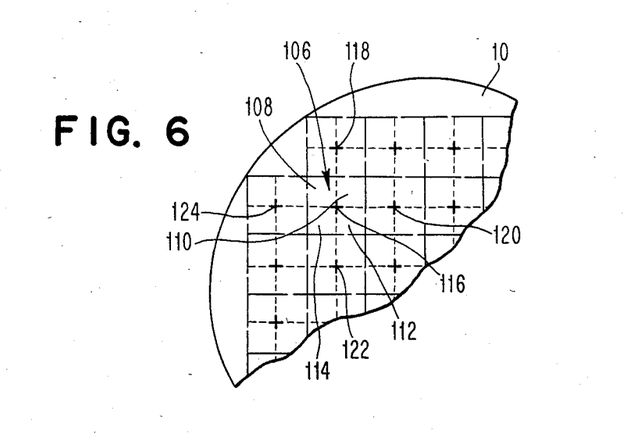
FIG. 6 is a plan view of an illustrative wafer carrying the wafer alignment marks shown in FIG. 3.

When the wafer and printing mask have been aligned, the next step involves flood exposure of the printing mask with actinic radiation. Obviously, objective 38 may not physically block the actinic radiation. One possibility is that the alignment optical system could be moved away. This is practical because the alignment optical system need not be precisely positioned in the X-Y plane. Thus, it is possible to move the alignment system to one side along supporting tracks or rails. FIG. 6 illustrates how a step-and-repeat alignment system might be set up so as to avoid any need to move the alignment optical system. Wafer 10 is shown with alignment marks located in the center of each square step-and-repeat field each field comprising four chip areas. Assume that printing of field 106 is desired, comprising chip areas 108, 110, 112, 114, if alignment mark 116 is used, the optical system would block subsequent irradiation of field 106. However, other alignment marks are available to use instead. For example an alignment optical system could be positioned on each of the four sides of the field to be aligned, in this case looking at alignment marks 118, 120, 122, and 124. At least two of these alignment systems would then be positioned over an alignment mark even when aligning a field located along an edge. At least two alignment marks are needed to make an accurate rotational alignment. By having four separate alignment optical systems redundant data is also available for implementation of more sophisticated data processing functions.

In general, direct separate sensing of rotational errors in alignment is not needed. Overall system alignment begins by rotationally aligning the alignment mask with respect to the X-Y directions of the table using marks at spaced locations.

Then, a printing mask is rotationally aligned to the alignment mask and finally the wafer is aligned to the alignment mask. Once rotational alignment is thus achieved, the X-Y table system can be relied upon to maintain rotational alignment, or the rotational alignments can be periodically corrected.

Figure 5:
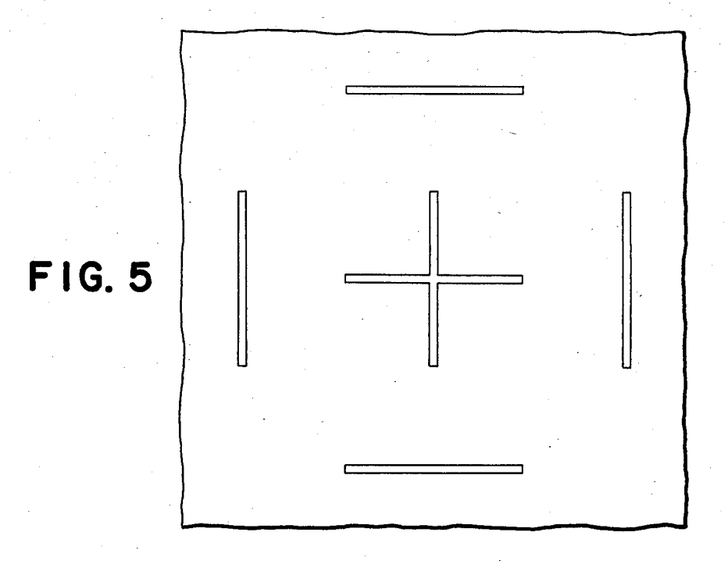
FIG. 5 is an alternative alignment mask which may be used to align the FIG. 3 wafer and proximity mask alignment marks in bright field illumination rather than dark field illumination.

FIG. 5 illustrates a bright field alignment mask which can be used with the marks illustrated in FIG. 3. It should be noted that the widths of the slits are smaller than the widths of the alignment mark bars. Therefore, signal extremums will not be sharp. There will be a sudden change as the slit image encounters and begins to overlap a bar. Then the signal will not change much until the slit image begins to encounter the opposite edge and correlation of the slit image and bar begins to decline. Narrow slits are used so that edges can be sharply detected. In this situation however, alignment occurs when the slit image is centered on the bar, a position which must be electronically extrapolated from the location of the edges.

Figure 8:
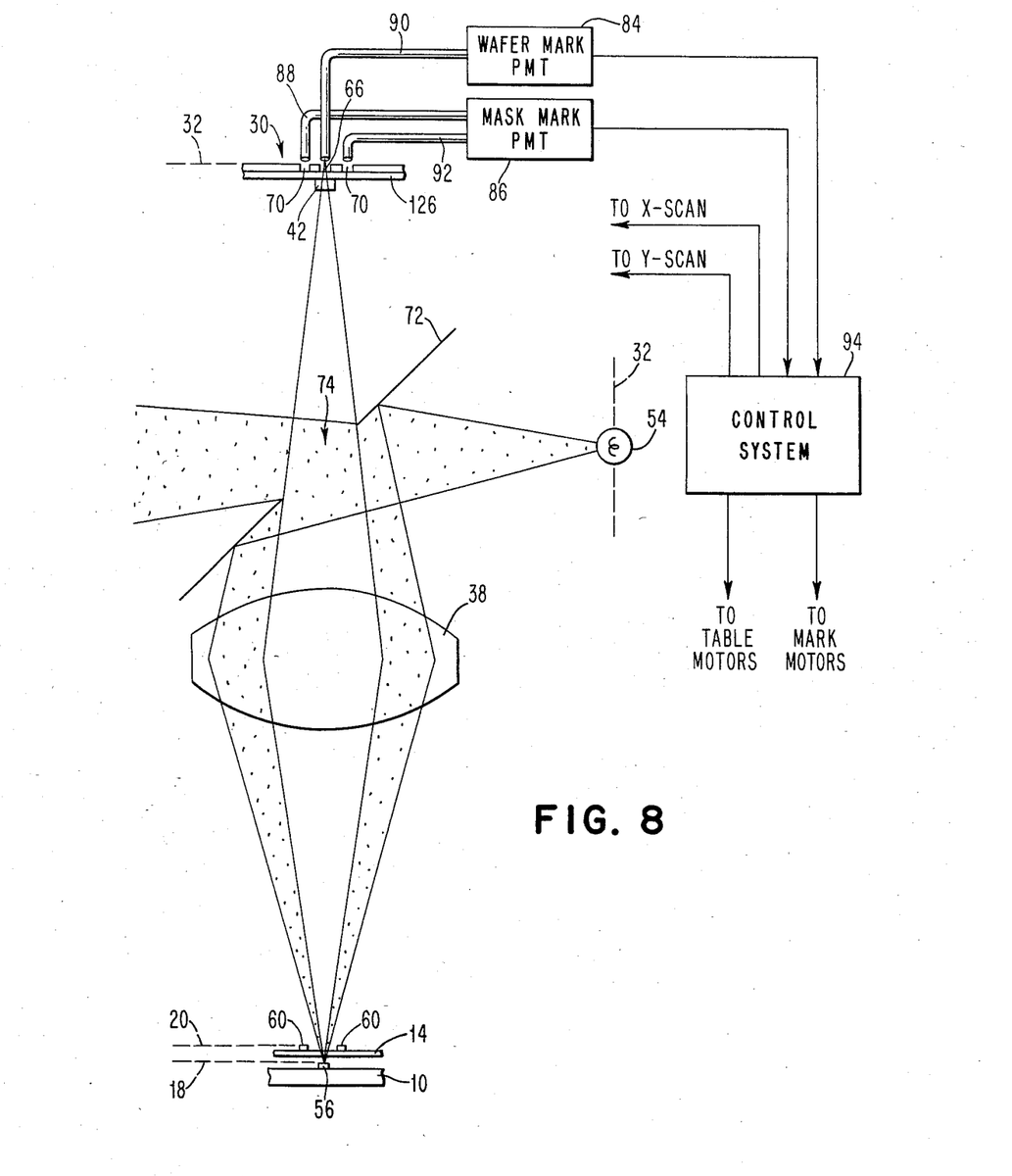
FIG. 8 shows a system similar to the one illustrated in FIG. 2 with the light monitoring and light generating elements exchanged in position.

FIG. 8 illustrates the dark field alignment system shown in FIG. 2 with the alignment radiation source and optical fibers exchanged in position. As shown, the mirror 72 now reflects the outer illumination light down onto the alignment marks. The illuminated marks are then imaged by objective 38 onto plane 32. When the wafer is properly aligned, the light scattered from the edges of the wafer mark will pass through the mask pattern 34 and be received by fiber 90. Light scattered from the edges of the printing mask mark will pass through the mask pattern 36 when the printing mask is in alignment. Alignment mask 30 may or may not be carried on a transparent support. A transparent mask support 126 is illustrated in FIG. 8 and FIG. 2.

Many changes and modifications can be made to my invention which will be apparent to anyone of ordinary skill and which can be made without departing from the spirit and scope of my invention. For example, block 42 may be replaced with an appropriate lens element. Also, the positions of the alignment mask patterns could be axially separated to compensate for the difference in position between planes 18, 20, thereby eliminating the need for a separate physical compensation element. It should also be apparent that separate alignment optical systems could be used for the X and Y directions, much as described in my U.S. Pat. No. 4,232,969.

Having thus described my invention, what I claim as new, and desire to secure by Letters Patent is:

1. Apparatus for aligning a microcircuit wafer with respect to an overlying closely spaced lithography mask, comprising:

a first alignment mark on said microcircuit wafer;

a second alignment mark on said lithography mask, one of said alignment marks defining a first plane and the other of said alignment marks defining a second plane, said first and second planes being parallel and closely spaced;

alignment mask means defining a third plane;

said alignment mask means having a first mask pattern corresponding with said first alignment mark and a second mask pattern corresponding with said second alignment mark;

lens means imaging said first and third planes onto each other;

means for compensating for the difference in position between said first and second planes such that when said wafer and lithography mask are aligned with each other, said lens means images said first mask pattern and said first alignment mark onto each other and at the same time images said second mask pattern and second alignment mark onto each other;

light splitting means positioned between said lens means and said third plane, said light splitting means defining a fourth plane such that said lens means also images said first and fourth planes onto each other, thereby forming first and second bidirectional light propagation paths when said wafer and lithography mask are aligned, said first light propagation path extending from said first mask pattern through said light splitting means and lens means to said first alignment mark and from said first alignment mark through said lens means and light splitting means to a first position optically in the vacinity of said fourth plane, and said second light propagation path extending from said second mask pattern through said light splitting means and lens means to said second alignment mark and from said second alignment mark through said lens means and light splitting means to a second position optically in the vacinity of said fourth plane;

a source of alignment radiation for illuminating one end of said first light propagation path and one end of said second light propagation path;

means for monitoring alignment radiation intensity at the other end of said first light propagation path and alignment radiation intensity at the other end of said second light propagation path; and means for adjusting the relative position of said wafer and lithography mask until said monitored alignment radiation intensities indicate that said wafer and lithography mask are in alignment.

2. Alignment apparatus as defined in claim 1 wherein said means for compensating comprises a block of transparent material covering one but not the other of said first and second alignment mask patterns.

3. Alignment apparatus as defined in claim 1 wherein said second alignment mark defines said first plane.

4. Alignment apparatus as defined in claim 1 wherein said first mask pattern comprises transparent slits corresponding to edges of said first alignment mark and said second mask pattern comprises transparent slits corresponding to edges of said second alignment mark.

5. Alignment apparatus as defined on claim 1 wherein said light splitting means comprises an apertured mirror.

6. Alignment apparatus as defined in claim 1 wherein said source of alignment radiation illuminates the side of said alignment mask remote from said lens means.

7. Alignment apparatus a defined in claim 1 wherein said source of alignment radiation illuminates said first and second alignment marks and said lens means projects an image of said first and second alignment marks onto said alignment mask.

8. Alignment apparatus as defined in claim 1 wherein said means for monitoring comprises means for visually observing.

9. Alignment apparatus as defined in claim 1 wherein said means for monitoring alignment radiation intensity at the other end of said first light propogation path comprises a first electro-optical detector and said means for monitoring alignment radiation intensity at the other end of said second light propogation path comprises a second electro-optical detector.

10. Alignment apparatus as defined in claim 1 wherein said monitored alignment radiation intensities indicate that said wafer and lithography mask are in alignment when said intensities reach an extremum.

11. Alignment apparatus as defined in claim 10 wherein said extremums are both maximums.

12. Alignment apparatus as defined in claim 1 wherein said monitored intensities do not have sharp extremums, said wafer and lithography mask being in alignment when both radiation intensities are at midpoints of an extremum.

13. Alignment apparatus as defined in claim 1 wherein said first and second alignment marks are laterally displaced from each other when said wafer and lithography mask are aligned.

14. Alignment apparatus as defined in claim 1 wherein said means for adjusting the relative position of said wafer and lithography mask automatically responds to said monitored radiation intensities and urges said wafer towards an aligned position.

15. Alignment apparatus as defined in claim 1 wherein an image projected by said lens means is caused to positionally scan back and forth.

16. Alignment apparatus as defined in claim 1 wherein said lens means projects a dark field image.

17. Alignment apparatus as defined in claim 16 wherein said dark field image is an image of said first and second alignment mask patterns.

18. Alignment apparatus as defined in claim 16 wherein said dark field image is an image of said first and second alignment marks.

* * * * *